United States Patent
Kozaki

(10) Patent No.: US 7,199,627 B2
(45) Date of Patent: Apr. 3, 2007

(54) DC-DC CONVERTER CONNECTED TO PHASE LOCKED LOOP

(75) Inventor: Minoru Kozaki, Suwa (JP)

(73) Assignee: Seiko Epson Corporation (JP)

( * ) Notice: Subject to any disclaimer, the term of this patent is extended or adjusted under 35 U.S.C. 154(b) by 155 days.

(21) Appl. No.: 11/011,236

(22) Filed: Dec. 14, 2004

(65) Prior Publication Data

US 2005/0127887 A1    Jun. 16, 2005

(30) Foreign Application Priority Data

Dec. 15, 2003    (JP)    ............................. 2003-416434

(51) Int. Cl.
*H03L 7/06*    (2006.01)
(52) U.S. Cl. .................................................. 327/157
(58) Field of Classification Search ................ 327/157, 327/156, 155, 243
See application file for complete search history.

(56) References Cited

U.S. PATENT DOCUMENTS 4,641,042 A * 2/1987 Miyazawa ................... 307/66
6,429,416 B1 * 8/2002 Porter ................... 250/214 VT
6,608,522 B1 * 8/2003 Mumper et al. ............... 330/51

FOREIGN PATENT DOCUMENTS

| JP | 2000-175447 | 6/2000 |
|----|-------------|--------|
| JP | 2001-103738 | 4/2001 |
| JP | 2001-157437 | 6/2001 |

OTHER PUBLICATIONS

A. Hajimir, S. Limotryakis, T. Lee, Jitter and Phase Noice in Ring Oscillators, IEEE Journal of Solid-State Circuits, vol. 34, No. 6, Jun. 1999.
B. Drakhlis, Calculate Oscillator Jitter by Using Phase-Noise Analysis, Microwaves & RJ, Jan. 2001.

* cited by examiner

*Primary Examiner*—Shawn Riley
(74) *Attorney, Agent, or Firm*—Harness, Dickey & Pierce, P.L.C.

(57) ABSTRACT

A DC-DC converter is provided. The DC-DC converter is connected to a PLL circuit, supplying a voltage at least to a power source terminal of a voltage controlled oscillator of the PLL circuit. A frequency of a ripple voltage included in the voltage is less than a natural frequency of the PLL circuit or more than one-half of a frequency of an output signal of the PLL circuit.

6 Claims, 3 Drawing Sheets

DC-DC CONVERTER CONNECTED TO PHASE LOCKED LOOP

RELATED APPLICATIONS

This application claims priority to Japanese Patent Application No. 2003-416434 filed Dec. 15, 2003 which is hereby expressly incorporated by reference herein in its entirety.

BACKGROUND

1. Field of the Invention

The present invention relates to a DC-DC converter, and particularly to a DC-DC converter connected to a PLL (Phase Locked Loop) circuit.

2. Related Art

A PLL circuit has a voltage controlled oscillator to generate a signal of a desired frequency, while the voltage controlled oscillator generates a signal of the desired frequency under control of an input voltage by which the frequency of the signal is changed. The voltage controlled oscillator is supplied with a power source voltage necessary for the operation from a DC-DC converter. The DC-DC converter performs a switching operation to generate a desired DC voltage from another DC voltage, that is, a DC to DC conversion. In the voltage generated by the above-mentioned switching operation of the DC-DC converter, there is included a ripple voltage (AC component superposing on the DC voltage) resulting from the switching operation. An example of this type of DC-DC converter is described in Japanese Unexamined Patent Publication No. 2001-157437 (FIG. 12).

In the above-mentioned PLL circuit, a frequency of a signal generated by the voltage controlled oscillator fluctuates because of the ripple voltage being included in the voltage to be supplied from the DC-DC converter. Thus, a problem of generating a large amount of jitter arises.

SUMMARY

First DC-DC Converter

A first DC-DC converter according to the present invention is a DC-DC converter connected to a PLL circuit, supplying a voltage at least to a power source terminal of a voltage controlled oscillator of the PLL circuit, a frequency of a ripple voltage included in the voltage is less than a natural frequency of the PLL circuit.

According to the first DC-DC converter of the present invention, since a frequency of the ripple voltage included in the voltage to be supplied from the DC-DC converter to the PLL circuit is less than the natural frequency of the PLL circuit which is a frequency region in which a jitter value appearing in a signal generated by the PLL circuit is relatively small, the amount of the jitter value may be reduced as compared to the conventionally possible amount.

The first DC-DC converter according to the present invention performs switching for a DC to DC conversion at a frequency less than the natural frequency of the PLL circuit.

Second DC-DC Converter

A second DC-DC converter according to the present invention is a DC-DC converter connected to a PLL circuit, supplying a voltage at least to a power source terminal of a voltage controlled oscillator of the PLL circuit, a frequency of a ripple voltage included in the voltage is more than one half of the frequency of the output signal of the PLL circuit.

According to the second DC-DC converter of the present invention, since the frequency of the ripple voltage included in the voltage to be supplied from the DC-DC converter to the PLL circuit is more than one half the frequency of the output of the PLL circuit which is a frequency region in which the jitter value appearing in a signal generated by the PLL circuit is relatively small, the amount of the jitter value may be reduced as compared to the conventionally possible amount.

The second DC-DC converter according to the present invention performs switching for a DC to DC conversion at a frequency more than one half the frequency of the output of the PLL circuit.

Third DC-DC Converter

A third DC-DC converter according to the present invention is a DC-DC converter connected to a PLL circuit, supplying a voltage at least to a power source terminal of a voltage controlled oscillator of the PLL circuit, a frequency of a ripple voltage included in the voltage is an integer multiple of the frequency of the output signal of the PLL circuit.

According to the third DC-DC converter of the present invention, since the frequency of the ripple voltage included in the voltage to be supplied from the DC-DC converter to the PLL circuit is an integer multiple of the frequency of the output of the PLL circuit in which the jitter value appearing in a signal generated by the PLL circuit is virtually 0, the amount of the jitter value may be reduced as compared to the conventionally possible amount.

The third DC-DC converter according to the present invention performs switching for a DC to DC conversion at a frequency of an integer multiple of the frequency of the output signal of the PLL circuit.

DETAILED DESCRIPTION

Working Example 1

Figure 1:
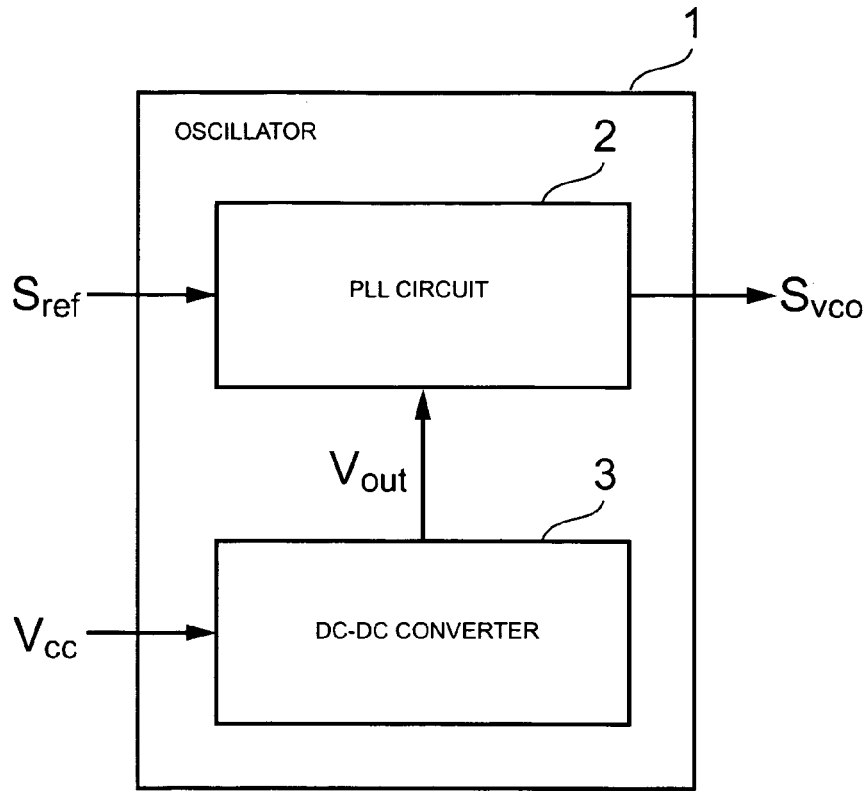
FIG. 1 is a diagram showing a configuration of an oscillator of Working Example 1.

FIG. 1 is a block diagram showing a configuration of an oscillator of Working Example 1 according to the present invention. As shown in FIG. 1, the oscillator of Working Example 1 consists of a PLL circuit 2 generating an oscillation clock $S_{vco}$ which has a desired frequency $f_{vco}$ based on a reference clock $S_{ref}$ having a reference frequency $f_{ref}$, and a DC-DC converter 3 generating an output voltage $V_{out}$ by performing switching for a DC to DC conversion to an input voltage $V_{cc}$ to supply the output voltage $V_{out}$ to the PLL circuit 2.

PLL Circuit

Figure 2:
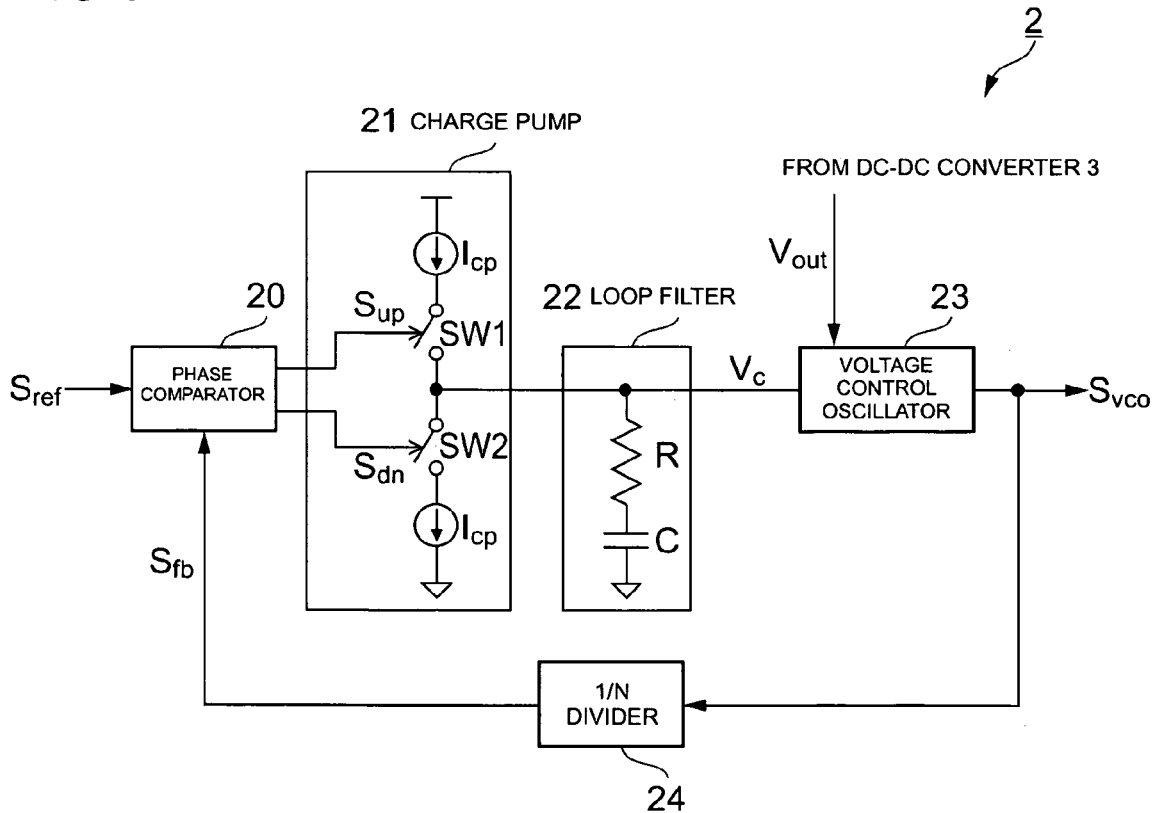
FIG. 2 is a diagram showing a configuration of a PLL circuit of Working Example 1.

FIG. 2 is a circuit diagram showing a configuration of a PLL circuit of Working Example 1 according to the present invention. The PLL circuit 2 of Working Example 1 has a conventionally known configuration, specifically, as shown in FIG. 2, consisting of a phase comparator 20, a charge pump 21, a loop filer 22, a voltage controlled oscillator 23, and a 1/N divider 24.

The phase comparator 20 compares a phase of the reference clock $S_{ref}$ which is supplied from a reference clock generator (un-illustrated) such as a quartz crystal oscillator, to a phase of a feedback clock $S_{fb}$ outputted from the 1/N divider 24, specifically, comparing leading edges or trailing edges of both clocks to each other, and outputting a time difference signal $S_{up}$ or $S_{dn}$, which are pulse signals showing a time difference between the both clocks, to the charge pump 21. The phase comparator 20, to be more accurate, if the feedback signal $S_{fb}$ is behind the reference clock $S_{ref}$, outputs the difference signal $S_{up}$ indicating the amount of lag, and if the feedback signal $S_{fb}$ is ahead of the reference clock $S_{ref}$, outputs the difference signal $S_{dn}$ indicating the amount of lead.

As shown in FIG. 2, the charge pump 21 comprises two switches, SW1 and SW2. The two switches are connected in series between the power source potential and ground potential and perform switching operation in accordance with the time difference signals $S_{up}$ and $S_{dn}$. In the charger pump 21, when the time difference signal $S_{up}$ is inputted from the phase comparator 20, during the time differential signal $S_{up}$ is being impressed, a charging current $I_{cp}$ for charging the loop filter 22 is put out to the loop filter 22, while, on the other hand, when the time differential signal $S_{dn}$ is inputted from the phase comparator 20, during the time difference signal $S_{dn}$ is being impressed, the discharging current $I_{cp}$ for discharging the loop filter 22 is drawn from the loop filter 22.

The loop filter 22 comprises a resistor R and a capacitor C mutually connected in series, and by accumulating a current put out or drawn by the charger pump 21, there is generated a smoothed control voltage $V_c$ for controlling operation of the voltage controlled oscillator 23.

The voltage controlled oscillator 23 generates an oscillation clock $S_{vco}$ having a frequency $f_{vco}$ corresponding to a level of the control voltage $V_c$ outputted from the loop filter 22 and outputs the oscillation clock $S_{vco}$ to outside of the oscillator 1, while, at the same time, outputting it also to the 1/N divider 24. Specifically, the larger the control voltage $V_c$ is, the higher the frequency of the oscillation clock $S_{vco}$ is, whereas, the lower the control voltage $V_c$ is, the lower the frequency of the oscillation clock $S_{vco}$ is.

The 1/N divider 24 generates a feedback clock $S_{fb}$ of a feedback frequency $f_{fb}$ by dividing the oscillation clock $S_{vco}$ outputted from the voltage controlled oscillator 23 by N, and outputs the feedback clock $S_{fb}$ to the phase comparator 20.

As mentioned above, in the PLL circuit 2 of Working Example 1, the level of the control voltage $V_c$ is changed to adjust the frequency $f_{vco}$ of the oscillation clock $S_{vco}$ which is generated by the voltage controlled oscillator 23 so that the phase of the reference clock $S_{ref}$ matches the phase of the feedback clock $S_{fb}$. As a result, when the PLL circuit 2 is operating at a steady state, a time difference or a phase difference between the reference clock $S_{ref}$ and the feedback clock $S_{fb}$ converges to a constant steady-state error (including 0). In other words, the frequency $f_{ref}$ of the reference clock $S_{ref}$ and the frequency $f_{fb}$ of the feedback clock $S_{fb}$ become completely identical, whereupon the PLL circuit 2 stably outputs the oscillation clock $S_{vco}$ having a frequency $f_{vco}$ which is an N multiple of the frequency $f_{ref}$ of the reference clock $S_{ref}$.

DC-DC Converter and Clock Generating Circuit

Figure 3:
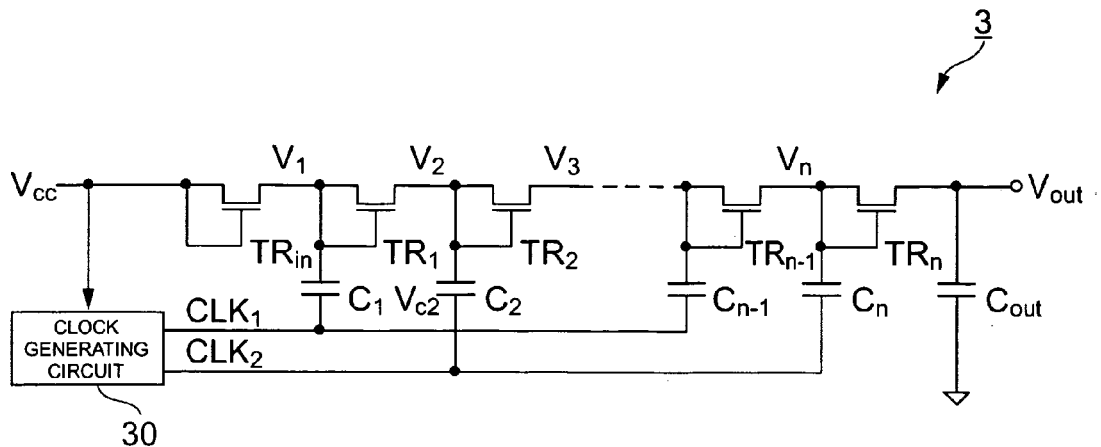
FIG. 3 is a diagram showing a configuration of a DC-DC converter of Working Example 1.

FIG. 3 is a circuit diagram showing a configuration of a DC-DC converter of Working Example 1. The DC-DC converter 3 is a step-up type DC-DC converter which converts an input voltage $V_{cc}$ supplied from an outside power source (un-illustrated) to an output voltage $V_{out}$ of a higher voltage than the input voltage $V_{cc}$, and to be more specific, of a charge pump type DC-DC converter. The DC-DC converter 3 consists of a clock generating circuit 30 generating the reference clocks $CLK_1$ and $CLK_2$, n pieces (n is an arbitrary positive integer) of NMOS transistors $TR_1$–$TR_n$ connected in series between the input voltage $V_{cc}$ and the output voltage $V_{out}$, capacitors $C_1$–$C_n$ connected between each of NMOS transistors $TR_1$–$TR_n$ and either the reference clocks $CLK_1$ or $CLK_2$, a transistor $TR_{in}$ inserted in a former stage of the transistor $TR_1$, and a capacitor $C_{out}$ mounted at a latter stage of the transistor $TR_n$. The reference clocks $CLK_1$ and $CLK_2$ herein have a peak voltage that is the same as the input voltage $V_{cc}$ and complimentary make transitions between the input potential $V_{cc}$ (high level) and the ground potential (low level).

Figure 4:
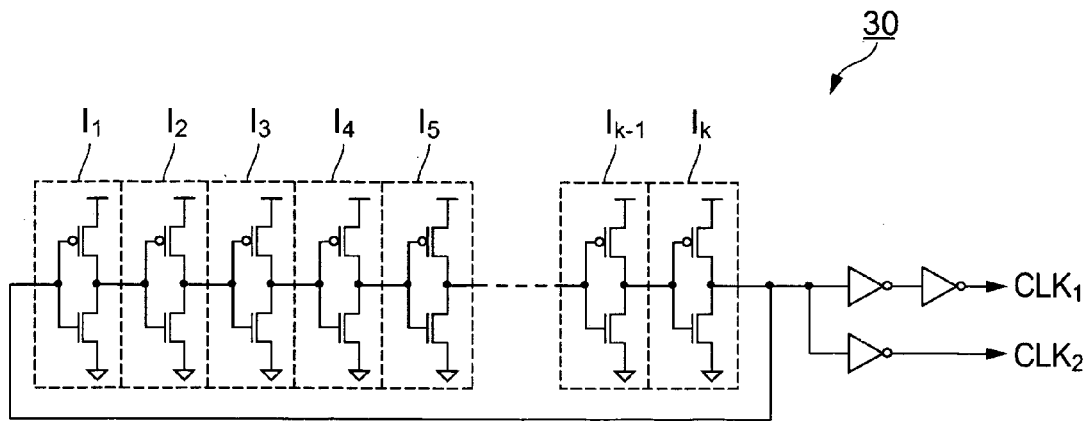
FIG. 4 is a diagram of a configuration of a clock generating circuit of Working Example 1.

FIG. 4 is a circuit diagram showing a configuration of the clock generating circuit of Working Example 1. The clock generating circuit 30 of Working Example 1 is a ring oscillator in which k pieces (k is any arbitrary positive odd number) of inverter circuits $I_1$–$I_k$ are connected in a ring shape. The frequency of the reference clocks $CLK_1$ and $CLK_2$ generated by the clock generating circuit 30, that is the ring oscillator, are inversely proportional to the number of stages k of the inverter circuits $I_1$–$I_k$ and approximately inversely proportional to the square of a gate length L of MOS transistors that constitute each of the inverter circuits $I_1$–$I_k$. Therefore, the frequency of the reference clocks $CLK_1$ and $CLK_2$ can be set at a desired frequency by varying the number of stages k and the gate length L.

Operation of the DC-DC converter will be described. To facilitate explanation and understanding, it is assumed that current consumption of the PLL circuit 2 is sufficiently small, each gate capacitance of the transistors $TR_1$–$TR_n$ is sufficiently small as compared to the capacitance of capacitors $C_1$–$C_k$, and the threshold voltage of the transistors $TR_1$–$TR_n$ does not rise due to body effect. To further facilitate explanation, voltages of source terminals of transistors $TR_1$–$TR_n$ are denoted as $V_1$–$V_n$, and the threshold voltage of the transistors $TR_1$–$TR_n$ is assumed to be $V_T$.

First, when the reference clock $CLK_1$ is at the low level, the capacitor $C_1$ is charged by impression of the input voltage $V_{cc}$ through the transistor $TR_{in}$, whereby the voltage $V_1$ becomes $V_{cc}-V_T$.

Next, when the reference clock $CLK_1$ becomes the high level and the reference clock $CLK_2$ becomes the low level, the voltage $V_1$ is pushed up by the reference clock $CLK_1$ which is at the high level, to $(V_{cc}-V_T)+V_{cc}$ or $2V_{cc}-V_T$. Thus, the voltage $V_2$ becomes $V_1-V_T$ or $2(V_{cc}-V_T)$. At the same time, since the reference clock $CLK_2$ is at the low level, a voltage $V_{c2}$ between terminals of the capacitor C2 becomes identical to the voltage $V_2$.

Next, when the reference clock $CLK_2$ becomes the high level, the voltage $V_2$ is pushed up by the reference clock $CLK_2$, which is at the high level, to $2(V_{cc}-V_T)+V_{cc}$ or $3V_{cc}-V_T$. Thus, the voltage $V_3$ becomes $V_2-V_T$ or $3(V_{cc}-V_T)$.

Thereafter, the voltage is stepped up sequentially through repetition of the above-mentioned operation. By these means, finally, the output voltage $V_{out}$ is boosted up to $(n+1)(V_{cc}-V_T)$. In summary, the DC-DC converter 3 generates the desired output voltage $V_{out}$ corresponding to the set number of stages n, thus enabling the output voltage $V_{out}$ to be impressed on each composing part of the PLL circuit 2 such as the voltage controlled oscillator 23.

At this point, in the output voltage $V_{out}$, there is included a ripple voltage $V_r$ resulting from the switching operation of the transistor $TR_n$ based on the reference clock $CLK_2$. A relationship between the frequency $f_m$ of the ripple voltage $V_r$ and an effective value σ of period jitter (scattering of periods) that appears in the oscillation clock $S_{vco}$ outputted from the voltage controlled oscillator 23 due to the ripple voltage $V_r$ is, for example, expressed by formula (1-1), $$\sigma = \frac{K_m V_m}{\sqrt{2}\,\pi f_{vco}} \cdot \frac{f_m}{\sqrt{(f_m^2 - f_n^2)^2 + (2\zeta f_m f_n)^2}} \cdot \left|\sin\left(\frac{f_m}{f_{vco}}\pi\right)\right| \quad (1\text{-}1)$$

where $K_m$ (unit: Hz/V) is a fluctuation sensitivity of an oscillation frequency of the voltage controlled oscillator relative to the ripple voltage, $V_m$ (unit: V) is an amplitude of the ripple voltage, $f_m$ (unit: Hz) is a frequency of the ripple voltage, $f_n$ (unit: Hz) is a natural frequency of the PLL circuit 2, and ζ is a dumping coefficient of the PLL circuit 2.

Derivation of the Period Jitter Equation

Description will be made regarding the derivation of the equation (1-1) which shows the relationship between the ripple voltage $V_r$ included in the output voltage $V_{out}$, which is outputted from the DC-DC converter 3 to the voltage controlled oscillator 23, and the effective value σ of the period jitter of the oscillation clock $S_{vco}$ generated by the voltage controlled oscillator 23.

An amount of phase fluctuation (effective value) of the oscillation clock $S_{vco}$ generated by the ripple voltage $V_r$ is expressed by formula (1-2), $$\Delta\phi_{RMS} = \frac{G(f_m)}{\sqrt{2}} \left(\frac{K_m V_m}{f_m}\right) \quad (1\text{-}2)$$

where $G(f_m)$ is a function representing a degree of suppressing phase fluctuation due to phase locking operation of the PLL circuit 2.

Employing the formula (1-2), single side band power spectrum $S\phi(f)$ of the phase fluctuation appearing in the oscillation clock $S_{vco}$ is expressed by formula (1-3), $$S_\phi(f) = \Delta\phi_{RMS}^2 \delta(f_m - f) = \frac{G(f_m)^2}{2}\left(\frac{K_m V_m}{f_m}\right)^2 \delta(f_m - f) \quad (1\text{-}3)$$

where δ(•) is the Dirac delta function.

Once the single side band power spectrum $S\phi(f)$ of the phase fluctuation is defined, the effective value σ of the period jitter is given by formula (1-4).

$$\sigma = \frac{1}{\pi f_{vco}}\sqrt{\int_0^\infty S_\phi(f)\sin^2\left(\frac{f}{f_{vco}}\pi\right)df} \quad (1\text{-}4)$$

-continued $$= G(f_m)\frac{K_m V_m}{\sqrt{2}\,\pi f_{vco} f_m}\left|\sin\left(\frac{f_m}{f_{vco}}\pi\right)\right|$$

If the PLL circuit 2 is a system having the simplest second order transfer function as illustrated in FIG. 2, the function $G(f_m)$ in the formula (1-2) shows a typical second order low-frequency cut-off characteristic and is expressed by formula (1-5).

$$G(f_m) = \frac{f_m^2}{\sqrt{(f_m^2 - f_n^2)^2 + (2\zeta f_m f_n)^2}} \quad (1\text{-}5)$$

The natural frequency $f_n$ and the dumping coefficient ζ of the PLL circuit 2 are given by formula (1-6) and formula (1-7), respectively, $$f_n = \frac{1}{2\pi}\sqrt{\frac{I_{cp}}{CN}K_v} \quad (1\text{-}6)$$

$$\zeta = \frac{R}{2}\sqrt{\frac{I_{cp}C}{N}K_v} \quad (1\text{-}7)$$

where $K_v$ (unit: Hz/V) represents sensitivity of the voltage controlled oscillator 23 relative to the control voltage $V_c$.

If the effective value σ of the period jitter shown by the formula (1-4) is rewritten, it may result in the formula (1-1).

$$\sigma = \frac{K_m V_m}{\sqrt{2}\,\pi f_{vco}} \cdot \frac{f_m}{\sqrt{(f_m^2 - f_n^2)^2 + (2\zeta f_m f_n)^2}} \cdot \left|\sin\left(\frac{f_m}{f_{vco}}\pi\right)\right| \quad (1\text{-}1)$$

Graph of Periodic Jitter

Figure 5:
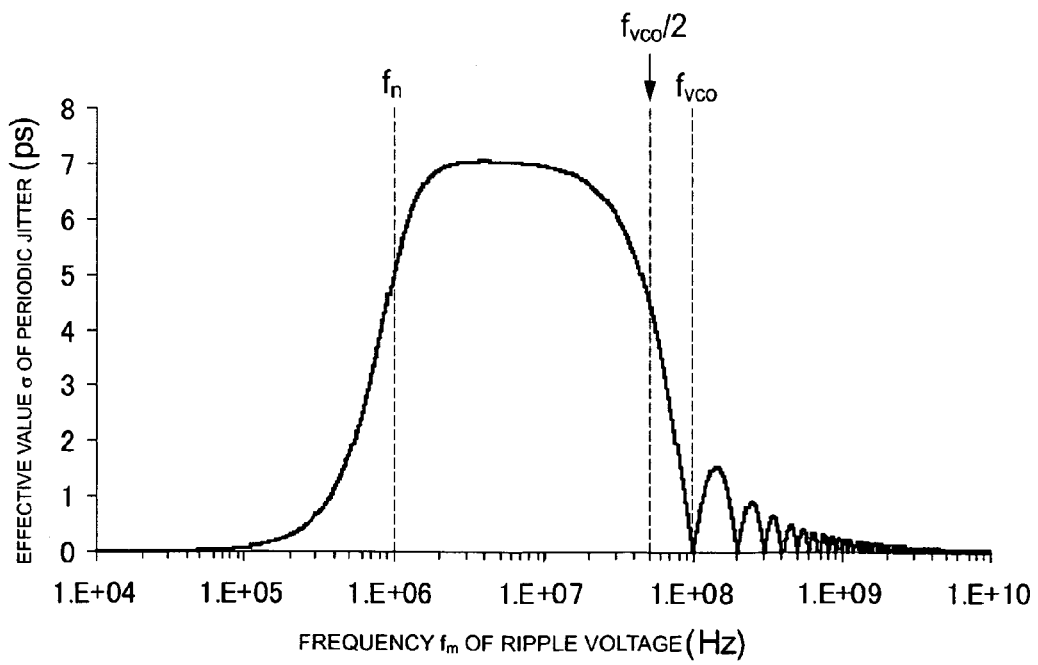
FIG. 5 is a graph showing a relationship between a frequency of a ripple voltage and an effective value of a period jitter of Working Example 1.

FIG. 5 is a graph showing a relationship between the frequency $f_m$ of the ripple voltage and the effective value σ of the period jitter defined in the formula (1-1). The graph of FIG. 5 is drawn under the condition that $V_m$=10 mV, $K_m$=10 MHz/V, $f_{vco}$=100 MHz, and ζ=0.7.

As apparent from the graph of FIG. 5, the effective value σ of the period jitter is large when the frequency $f_m$ of the ripple voltage $V_r$ is in a range approximately from the natural frequency $f_n$ of the PLL circuit 2 to ½ of the frequency $f_{vco}$ of the oscillation clock $S_{vco}$ of the PLL circuit 2. On the contrary, it is small when the frequency $f_m$ of the ripple voltage $V_r$ is below the natural frequency $f_n$ of the PLL circuit 2 or over ½ of the frequency $f_{vco}$ of the oscillation clock $S_{vco}$ of the PLL circuit 2. Further, as likewise apparent from the graph of FIG. 5, the effective value σ of the period jitter is 0 when the frequency $f_m$ of the ripple voltage $V_r$ is an integer multiple of the frequency $f_{vco}$ of the oscillation clock $S_{vco}$.

In the oscillator 1 illustrated in FIG. 1, according to the results of consideration based on the graph of FIG. 5 as described above, the clock generating circuit 30 shown in FIG. 4, which is provided on the DC-DC converter 3 illustrated in FIG. 3, outputs the reference clocks $CLK_1$ and $CLK_2$ having a frequency corresponding to any of (1) less than the natural frequency $f_n$ of the PLL circuit 2, (2) over ½ of the frequency $f_{vco}$ of the oscillation clock $S_{vco}$ of the PLL circuit 2, or (3) the integer multiple of the oscillation clock $S_{vco}$. Since the DC-DC converter 3 outputs, to the voltage controlled oscillator 23, the output voltage $V_{out}$ generated by the switching operation based on the reference clocks $CLK_1$ and $CLK_2$, there is no superposition of a ripple voltage $V_r$ which may have a frequency component functioning to increase the period jitter of the oscillation clock $S_{vco}$ of the voltage controlled oscillator 23. Therefore, the amount of the period jitter of the oscillation clock $S_{vco}$, which is outputted by the voltage controlled oscillator 23 operated by the output voltage $V_{out}$, can be reduced as apparent from the graph of FIG. 5.

Working Example 2

An oscillator of Working Example 2 will be described.

Figure 6:
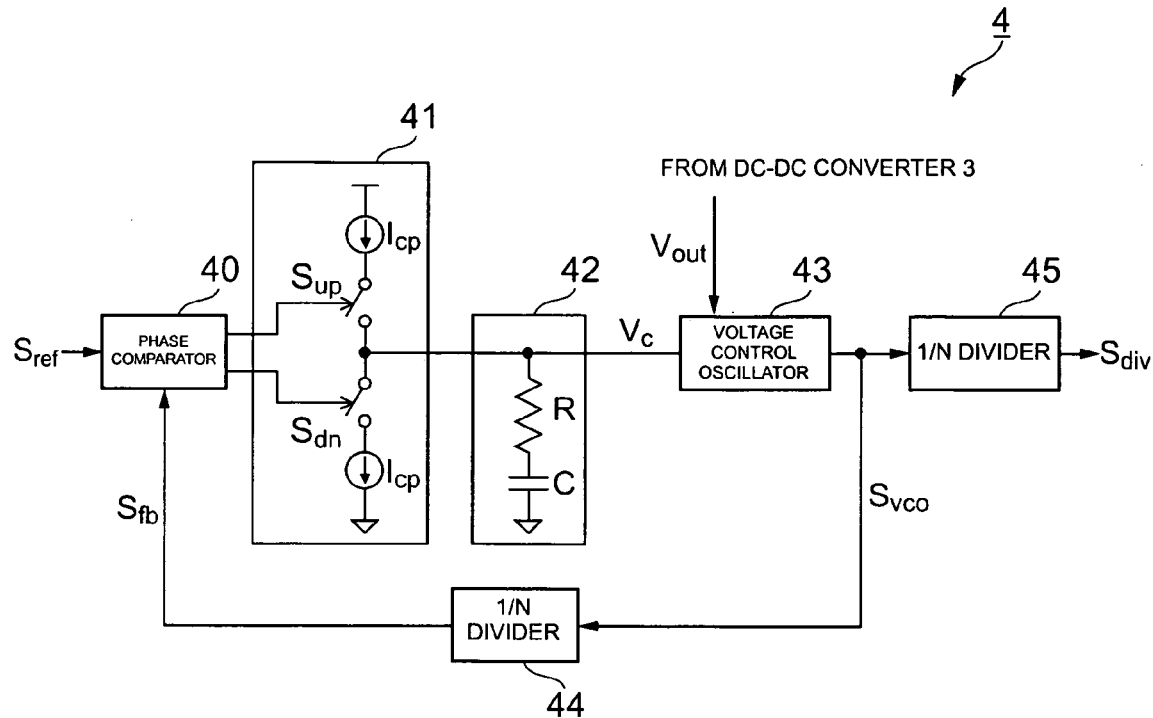
FIG. 6 is a diagram showing a configuration of a PLL circuit of Working Example 2.

FIG. 6 is a circuit diagram showing a configuration of a PLL circuit of Working Example 2. The oscillator of Working Example 2 has the same configuration as the oscillator 1 of Working Example 1 illustrated in FIG. 1, and to be more accurate, having the PLL circuit 4 shown in FIG. 6 instead of the PLL circuit 2 shown in FIG. 2 as well as the DC-DC converter 3 shown in FIG. 3.

As shown in FIG. 6, the PLL circuit 4 comprises the phase comparator 40, the charge pump 41, the loop filer 42, the voltage controlled oscillator 43, and the 1/N divider 44, which respectively have the same configuration and function as the phase comparator 20, the charge pump 21, the loop filer 22, the voltage controlled oscillator 23, and the 1/N divider 24 in the PLL circuit 2 of Working Example 1 shown in FIG. 2, and additionally including an 1/X divider 45 outputting a dividing clock $S_{div}$ having a frequency $f_{div}$ corresponding to 1/X of that of the oscillation clock $S_{vco}$.

An effective value σ of period jitter that appears in the dividing clock $S_{div}$ outputted from the 1/X divider 45 is expressed by formula (2-1).

$$\sigma = \frac{1}{\pi f_{div}} \sqrt{\int_0^\infty \frac{S_\phi(f)}{X^2} \sin^2\left(\frac{f}{f_{div}}\pi\right) df} \qquad (2\text{-}1)$$

$$= \frac{G(f_m)}{X} \cdot \frac{K_m V_m}{\sqrt{2}\,\pi f_{div} f_m} \left|\sin\left(\frac{f_m}{f_{div}}\pi\right)\right|$$

By rewriting in the same manner as rewriting formula (1-4) to the formula (1-1) in Working Example 1, the formula (2-1) may be modified as formula (2-2).

$$\sigma = \frac{K_m V_m}{\sqrt{2}\,\pi f_{vco}} \cdot \frac{f_m}{\sqrt{(f_m^2 - f_n^2)^2 + (2\zeta f_m f_n)^2}} \cdot \left|\sin\left(\frac{f_m}{f_{div}}\pi\right)\right| \qquad (2\text{-}2)$$

Figure 7:
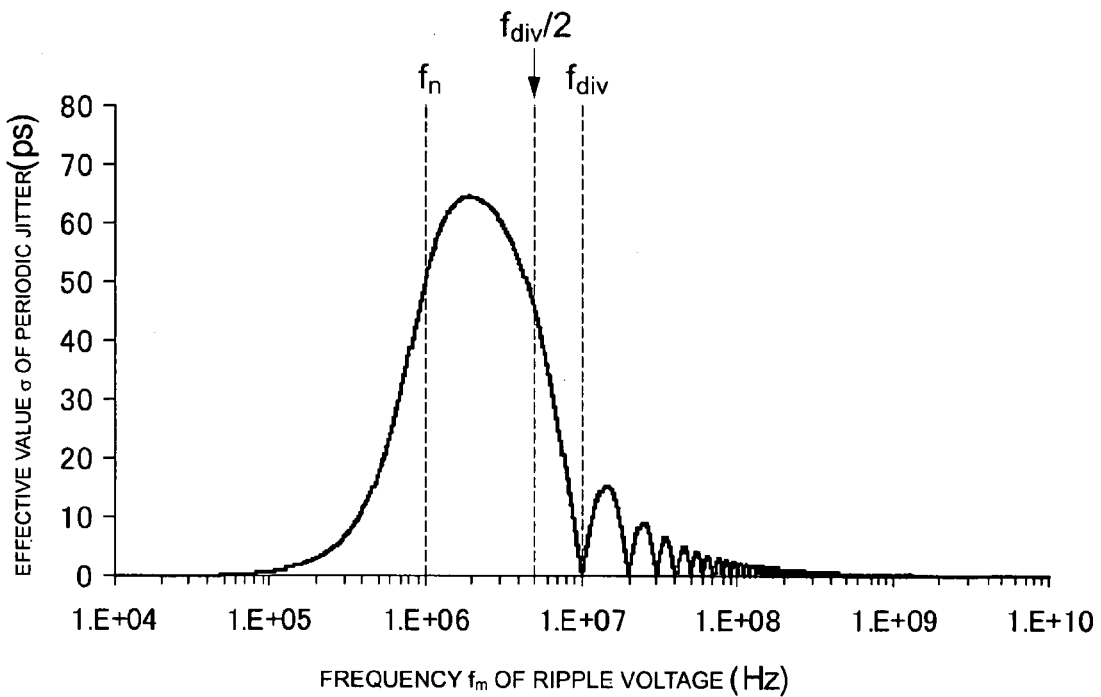
FIG. 7 is a graph showing the relationship between the frequency of the ripple voltage and the effective value of the period jitter of Working Example 2.

FIG. 7 is a graph showing a relationship between the frequency $f_m$ of the ripple voltage $V_r$ and the effective value σ of the period jitter. The graph of FIG. 7 is drawn under the condition that X=10 and other conditions are the same as those of the graph of FIG. 5.

As apparent from the graph of FIG. 7, in the same way as the graph of FIG. 5 of Working Example 1, the effective value σ of the period jitter is small when the frequency $f_m$ of the ripple voltage $V_r$ is approximately below the natural frequency $f_n$ of the PLL circuit 4 and over ½ of the frequency $f_{div}$ of the dividing clock $S_{div}$ of the PLL circuit 4, and 0 when the frequency $f_m$ of the ripple voltage $V_r$ is an integer multiple of the frequency $f_{div}$ of the dividing clock $S_{div}$ of the PLL circuit 4.

According to the results of consideration based on the graph of FIG. 7 as described above, in the same way as the oscillator 1 of Working Example 1, also in the oscillator of Working Example 2, the clock generating circuit 30 outputs the reference clocks $CLK_1$ and $CLK_2$ having a frequency corresponding to any of (1) less than the natural frequency $f_n$ of the PLL circuit 4, (2) over ½ of the frequency $f_{div}$ of the dividing clock $S_{div}$ of the PLL circuit 4, or (3) the integer multiple of the dividing clock $S_{div}$. Since the DC-DC converter 3 outputs, to the voltage controlled oscillator 43, the output voltage $V_{out}$ generated by the switching operations based on the reference clocks $CLK_1$ and $CLK_2$, there is no superposition of a ripple voltage $V_r$ which may have a frequency component functioning to increase the period jitter of the dividing clock $S_{div}$ of the voltage controlled oscillator 43. Therefore, the amount of the period jitter of the dividing clock $S_{div}$, which is outputted by the voltage controlled oscillator 43 operated by the output voltage $V_{out}$, can be reduced as apparent from the graph of FIG. 7.

It should be noted that in the two working examples described above, description was made by using the step-up DC-DC converter of the charge pump type, whereas, be it a chopper type DC-DC converter or a step-down DC-DC converter, the same means may produce the same results.

What is claimed is:

1. A DC-DC converter connected to a PLL circuit comprising:
   a clock generating circuit that generates first and second reference clock signals;
   a plurality of transistors connected in series that generate an output voltage based on the first and second reference clock signals and an input voltage, the output voltage powers a voltage controlled oscillator of the PLL circuit and the voltage controlled oscillator generates an oscillation clock based on a control voltage; and
   a plurality of capacitors, each of said plurality of capacitors corresponds to each of the plurality of transistors and connects the each of the plurality of transistors to one of the first reference signal and the second reference signal, wherein
   the output voltage includes a ripple voltage generated based on switching one of the plurality of transistors, the ripple voltage having a frequency less than a natural frequency of the PLL circuit.

2. The DC-DC converter according to claim 1, wherein the DC-DC converter performs a switching operation for a DC to DC conversion at a frequency of less than the natural frequency of the PLL circuit.

3. A DC-DC converter connected to a PLL circuit comprising:
   a clock generating circuit that generates first and second reference clock signals;
   a plurality of transistors connected in series that generate an output voltage based on the first and second reference clock signals and an input voltage, the output voltage powers a voltage controlled oscillator of the PLL circuit and the voltage controlled oscillator generates an oscillation clock based on a control voltage; and
   a plurality of capacitors, each of said plurality of capacitors corresponds to each of the plurality of transistors and connects the each of the plurality of transistors to one of the first reference signal and the second reference signal, wherein
   the output voltage includes a ripple voltage generated based on switching one of the plurality of transistors, the ripple voltage having a frequency more than one-half of a frequency of an output signal of the PLL circuit.

4. The DC-DC converter according to claim 3, wherein the DC-DC converter performs a switching operation for a DC to DC conversion at a frequency of more than one-half of the frequency of the output signal of the PLL circuit.

5. A DC-DC converter connected to a PLL circuit comprising:
a clock generating circuit that generates first and second reference clock signals;
a plurality of transistors connected in series that generate an output voltage based on the first and second reference clock signals and an input voltage, the output voltage powers a voltage controlled oscillator of the PLL circuit and the voltage controlled oscillator generates an oscillation clock based on a control voltage; and
a plurality of capacitors, each of said plurality of capacitors corresponds to each of the plurality of transistors and connects the each of the plurality of transistors to one of the first reference signal and the second reference signal, wherein
the output voltage includes a ripple voltage generated based on switching one of the plurality of transistors, the ripple voltage having a frequency that is an integer multiple of a frequency of the output signal of the PLL circuit.

6. The DC-DC converter according to claim 5, wherein the DC-DC converter performs a switching for a DC to DC conversion at a frequency which is an integer multiple of the frequency of the output signal of the PLL circuit.

* * * * *